(12) United States Patent
Szasz et al.

(10) Patent No.: US 11,520,324 B2
(45) Date of Patent: Dec. 6, 2022

(54) APPARATUS FOR PREDICTION OF THE RESIDUAL LIFETIME OF AN ELECTRICAL SYSTEM

(71) Applicant: ABB Schweiz AG, Baden (CH)

(72) Inventors: Paul Szasz, Plankstadt (DE); Kai Koenig, Walldorf (DE); Stephan Wildermuth, Laudenbach (DE); Joerg Gebhardt, Mainz (DE)

(73) Assignee: ABB Schweiz AG, Baden (CH)

( * ) Notice: Subject to any disclaimer, the term of this patent is extended or adjusted under 35 U.S.C. 154(b) by 525 days.

(21) Appl. No.: 16/511,018

(22) Filed: Jul. 15, 2019

(65) Prior Publication Data

US 2020/0019152 A1 Jan. 16, 2020

(30) Foreign Application Priority Data

Jul. 16, 2018 (EP) .................................... 18183760

(51) Int. Cl.
G05B 23/02 (2006.01)
G01R 31/327 (2006.01)
G07C 3/02 (2006.01)
G01R 31/00 (2006.01)

(52) U.S. Cl.
CPC ........... *G05B 23/0283* (2013.01); *G07C 3/02* (2013.01); *G01R 31/003* (2013.01); *G01R 31/327* (2013.01)

(58) Field of Classification Search
CPC .... G05B 23/0283; G06N 5/022; G06N 7/005; G07C 3/02; G01R 31/003; G01R 31/327; G01R 31/00
See application file for complete search history.

(56) References Cited

U.S. PATENT DOCUMENTS

| 8,478,479 B2* | 7/2013 | Ghelam | G05B 23/0283 |
| | | | 702/182 |
| 2009/0119029 A1* | 5/2009 | Voigtlaender | G05B 19/4065 |
| | | | 702/34 |
| 2012/0179326 A1 | 7/2012 | Ghelam | |

(Continued)

FOREIGN PATENT DOCUMENTS

| CN | 105701337 A * | 6/2016 | ............. G06F 19/00 |
| CN | 105701337 B | 6/2016 | |

(Continued)

*Primary Examiner* — Stephanie E Bloss
(74) *Attorney, Agent, or Firm* — Leydig, Voit & Mayer, Ltd.

(57) ABSTRACT

An apparatus for prediction of the residual lifetime of an electrical system includes: an input unit; a processing unit; and an output unit. The input unit provides at least one sensor data from at least one sensor to the processing unit, the at least one sensor data including a measurement of at least one physical parameter of at least one component of an electrical system. Each sensor data is associated with a corresponding sensor and relates to a measurement of one physical parameter of a corresponding component of the electrical system. Each sensor data extends over a plurality of time windows and is assigned to a certain data class, such that sensor data at a particular time window has a value that falls into one of the data classes. For each sensor data the processing unit assigns the sensor data at each time window into a corresponding measurement window.

18 Claims, 2 Drawing Sheets

(56) References Cited

U.S. PATENT DOCUMENTS

| | | | |
|---|---|---|---|
| 2013/0073257 A1* | 3/2013 | Williams | G01R 31/3274 |
| | | | 702/179 |
| 2015/0137819 A1* | 5/2015 | Giordano | H01H 1/0015 |
| | | | 324/418 |
| 2015/0234365 A1* | 8/2015 | Nilsson | G05B 15/02 |
| | | | 700/275 |
| 2015/0234951 A1* | 8/2015 | Andersson | G07C 5/0808 |
| | | | 703/2 |
| 2016/0076976 A1* | 3/2016 | Patrick | G05B 23/0224 |
| | | | 702/34 |
| 2018/0060832 A1* | 3/2018 | Korsedal, IV | G01M 99/005 |
| 2018/0137220 A1* | 5/2018 | Herbig | G06F 17/18 |
| 2018/0239850 A1* | 8/2018 | Rudolph | G06F 30/18 |

FOREIGN PATENT DOCUMENTS

| | | | | |
|---|---|---|---|---|
| CN | 106990357 A | 7/2017 | | |
| CN | 107238507 A | 10/2017 | | |
| JP | 5530020 B1 * | 6/2014 | | G01M 99/00 |
| WO | WO-2009053303 A1 * | 4/2009 | | B61K 9/08 |
| WO | WO-2016206696 A1 * | 12/2016 | | |
| WO | WO 2016206696 A1 | 12/2016 | | |

* cited by examiner

APPARATUS FOR PREDICTION OF THE RESIDUAL LIFETIME OF AN ELECTRICAL SYSTEM

CROSS-REFERENCE TO PRIOR APPLICATION

Priority is claimed to European Patent Application No. EP 18183760.0, filed on Jul. 16, 2018, the entire disclosure of which is hereby incorporated by reference herein.

FIELD

The present invention relates to apparatus for the prediction of the residual lifetime of an electrical system, system for the prediction of the residual lifetime of an electrical system, and method for the prediction of the residual lifetime of an electrical system.

BACKGROUND

Many working environments such as power plants pose particular risks for the health and safety of employees. For these environments, there are different kinds of safety-related equipment in order to prevent or mitigate situations where human life is endangered. Naturally, such equipment has to be carefully and regularly maintained. However, in many cases this results in expensive scheduled downtime. For example, electrical systems (e.g. switchgear) are expected to operate reliably over decades, while they are subject to a variable thermo-mechanical and dielectric load. This causes continuous ageing as a function of the lifetime load history, leading to wide variations in the actual service time of such systems. As the actual safe service time is unknown, maintenance has to be planned at safe intervals, causing associated cost. Also, the device design is made with large safety margins, again adding to total cost. Residual lifetime prediction is possible by evaluating data from thorough inspections of the switchgear at regular intervals, which is costly, and often not available. Alternatively, dedicated tests (e.g. destructive accelerated ageing tests) on switchgear components at a given time in the life of the device can provide the desired information, but this is also costly and very time consuming. In practice, mostly only hot spot temperature and sometimes overcurrent information is used to estimate actual reliability risks. However, the costs involved have historically been justified by the large impact of potentially failed switchgear. Finding the right amount of maintenance to save cost without compromising safety is not always easy for electrical equipment in power plants, such as switchgear.

U.S. Pat. No. 10,380,280 discloses, as seen in FIG. 1, a processing system for failure prediction of electronic components. The various components, modules, engines, etc., of the processing system may be implemented as instructions stored on a computer-readable storage medium, as hardware modules, one or more integrated circuits, as special-purpose hardware (e.g., application specific hardware, application specific integrated circuits (ASICs), application specific special processors (ASSPs), field programmable gate arrays (FPGAs), embedded controllers, hardwired circuitry, etc.), or as some combination or combinations of these. In examples, the engine(s) described may be a combination of hardware and programming. The programming may be processor executable instructions stored on a tangible memory, and the hardware may include a processing device for executing those instructions. A memory can store program instructions that when executed by the processing device implement the engines. The processing system may include the lifetime estimation engine and a lifetime comparison engine.

SUMMARY

In an embodiment, the present invention provides an apparatus for prediction of the residual lifetime of an electrical system, comprising: an input unit; a processing unit; and an output unit; wherein the input unit is configured to provide at least one sensor data from at least one sensor to the processing unit, the at least one the sensor data comprising a measurement of at least one physical parameter of at least one component of an electrical system, wherein each sensor data is associated with a corresponding sensor and relates to a measurement of one physical parameter of a corresponding component of the electrical system, wherein each sensor data extends over a plurality of time windows and is assigned to a certain data class, such that sensor data at a particular time window has a value that falls into one of the data classes, wherein for each sensor data the processing unit is configured to assign the sensor data at each time window into a corresponding measurement window on a basis that sensor data at a particular time window has a value that falls into that corresponding data class, wherein for each physical parameter of a component, the processing unit is configured to determine a load spectrum, the load spectrum comprising a sum of all data classes including the data values and duration in each data class for the corresponding physical parameter of a component, wherein the processing unit is configured determine a predicted lifetime for the component comprising application of an aging model from at least one aging model to the corresponding load spectrum for each physical parameter of a component, and wherein the processing unit is configured to determine a predicted lifetime for each component of the at least one component.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Therefore, it would be advantageous to have an improved technology for the determination of the residual lifetime of an electrical system.

It should be noted that the following described aspects of the invention apply also for the apparatus for the prediction of the residual lifetime of an electrical system, the system for the prediction of the residual lifetime of an electrical system, and the method for the prediction of the residual lifetime of an electrical system.

In a first aspect, there is provided an apparatus for prediction of the residual lifetime of an electrical system, comprising:
an input unit;
a processing unit; and
an output unit The input unit is configured to provide at least one sensor data from at least one sensor to the processing unit. The at least one the sensor data comprises the measurement of at least one physical parameter of at least one component of an electrical system. Each sensor data is associated with a corresponding sensor and relates to the measurement of one physical parameter of a corresponding component of the electrical system. Sensor data can be directly measured physical parameters (e.g. temperature, humidity, etc.) or derived values calculated by the processing units (e.g. gradients of temperature).

Each sensor data extends over a plurality of time windows and is assigned to a certain data class, which is defined by a minimum and a maximum value range. A sensor data falls into a specific data class, if its value is between the minimum and maximum value of the respective data class. A plurality of data classes encompasses the complete data range within which the respective sensor data can vary.

The processing unit is configured to assign each sensor data to one of the defined data classes and to determine the total duration of the sensor data within each data class by summing up the plurality of time windows of the sensor data within the respective data class. The plurality of data classes with the assigned measurement data and their duration is the measured load spectrum for the respective sensor data, or the according physical parameter. With progress in time this load spectrum is based on a continuously increasing data base, comprising the whole lifetime of the component or of the measurement and is so representative for the aging of the component.

The processing unit is additionally configured to determine a predicted lifetime for the component comprising application of an aging model from at least one aging model to the corresponding load spectrum for each physical parameter of a component, and wherein the processing unit is configured to determine a predicted lifetime for each component of the at least one component.

In other words, a real-time ageing calculator is provided, enabled by the use of sensors that can be operating continuously and that are generally affordable. Computational processing of sensor data is combined with deep knowledge of physical ageing models. Thus, the calculator is based on (possibly continuous) measurements of physical quantities over the lifetime of an electrical system or device, combined with lifetime estimation models applied to the measured data. The solution provides a continuously updated residual lifetime prediction as a function of the actual lifetime load spectrum. This increases system reliability and cost reduction by better planning of system maintenance.

Therefore, with increasing demand for cost optimization, an accurate prediction of the residual lifetime of electrical systems/devices (such as switchgear) is enabled, that provides for the tailoring of the maintenance cost to the needs, and allows for a lower cost design with smaller safety margins.

In this manner, a continuous prediction of the residual lifetime of electrical systems, like switchgear, is provided, through the collection and evaluation of historical sensor data collected up to the present time and used with appropriate models to make component lifetime predictions into the future. As the data base used to define the load spectrum of the measured physical parameter increases continuously over time, the reliability and accuracy of the model calculations of the residual lifetime also increases continuously.

In an example, the processing unit is configured to compare the predicted residual lifetimes of different components based on component-specific sensor data and determine a predicted residual lifetime of the complete electrical system, comprising a determination of the specific component among all monitored components that has the shortest predicted lifetime.

In this manner, the electrical system or device can be serviced or overhauled at the most appropriate time, and enables only those components that require service to be serviced as necessary.

In this way, a continuous prediction of the residual lifetime is provided that is of great value for operators. Continuously updated information on the expectable residual lifetime of the electrical system or device (e.g. switchgear) is enabled, or at least of its critical components with an acceptable reliability.

In an example, determination of the predicted residual lifetime of the electrical system comprises utilization of at least one safety margin.

In this way, an accurate determination of risk of electrical device failure can be factored into the lifetime determination, ensuring the safety of safety critical systems through effectively determined service and overhaul schedules.

In an example, each component of the at least one component has a different safety margin of the at least one safety margin.

In an example, the at least one physical property comprises one or more of temperature, humidity, electrical current, electrical resistance, vibration, acceleration, reaction time.

In an example, the at least one sensor data comprises one or more of temperature measurement data, humidity measurement data, electrical current measurement data, electrical resistance measurement data, vibration measurement data, acceleration measurement data, reaction time measurement data.

In an example, the at least one sensor comprises one or more of temperature sensor, humidity sensor, electrical current sensor, electrical resistance sensor, vibration sensor, accelerometer, reaction time sensor.

In an example, the sum of time windows of sensor data within one data class related to the total lifetime of the component defines the percentage of time within a certain data class.

In an example, for each physical parameter of a component the processing unit is configured to determine a plurality of rates of change of sensor data, wherein each time window of the plurality of time windows has an associated rate of change of sensor data assigned to it, and the different rates of change are assigned to defined data classes. Determination of the predicted lifetime for the component comprises utilization of the plurality of rates of change of sensor data for each physical parameter of the component in the different data classes, comparing to e.g. a defined maximum number of cycles within a certain data class or defining threshold values. If the threshold values for rate of change are exceeded by a defined number of data, the residual lifetime of the component is reduced according to the lifetime model in the processing unit.

In an example, the at least one aging model comprises one or more of Palmgren-Miner's rule, Arrhenius, Coffin-Manson, Eyring.

In an example, the aging model used for one physical parameter of a component is different to the aging model used for a different physical parameter of the component.

In an example, the at least one component comprises a busbar.

In an example, the electrical system is a switchgear or circuit breaker.

In a second aspect, there is provided a system for prediction of the residual lifetime of an electrical system, comprising:
   an apparatus for prediction of the residual lifetime of an electrical system according to the first aspect; and
   at least one sensor.

The at least one sensor is configured to acquire at least one sensor data comprising measurement of at least one physical parameter of at least one component of an electrical system. The at least one sensor is configured to provide the at least one sensor data to the processing unit of the apparatus.

In a third aspect, there is provided a method for prediction of the residual lifetime of an electrical system, comprising:
   a) providing at least one sensor data from at least one sensor to a processing unit, wherein the at least one sensor data comprises the measurement of at least one physical parameter of at least one component of an electrical system, wherein each sensor data is associated with a corresponding sensor and relates to the measurement of one physical parameter of a corresponding component of the electrical system, wherein each sensor data extends over a plurality of time windows and is assigned to a certain data class, such that sensor data at a particular time window has a value that falls into one of the data classes;
   b) assigning for each sensor data by the processing unit the sensor data at each time window into a corresponding data class on the basis that sensor data at a particular time window has a value that falls into that corresponding data class;
   c) determining for each physical parameter of a component by the processing unit the load spectrum, wherein the load spectrum is the sum of all data classes containing the sum of all measured data characterized by the value range and time duration within each data class, and
   d) determining by the processing unit a predicted lifetime for the component comprising application of an aging model from at least one aging model to the corresponding plurality of load spectrums for each physical parameter of a component;
   f) determining by the processing unit a predicted lifetime for each component of the at least one component, by carrying out steps c) and d) for each component of the at least one component.

The above aspects and examples will become apparent from and be elucidated with reference to the embodiments described hereinafter.

Figure 1:
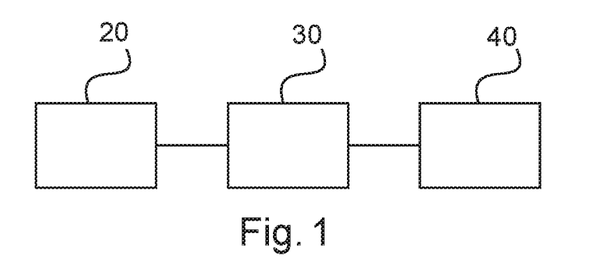
FIG. 1 shows a schematic representation of an example of an apparatus for the prediction of the residual lifetime of an electrical system.

FIG. 1 shows an example of an apparatus 10 for prediction of the residual lifetime of an electrical system. The apparatus 10 comprises an input unit 20, a processing unit 30, and an output unit 40. The input unit 20 is configured to provide at least one sensor data from at least one sensor to the processing unit 30. The at least one the sensor data comprises the measurement of at least one physical parameter of at least one component of an electrical system. Each sensor data is associated with a corresponding sensor and relates to the measurement of one physical parameter of a corresponding component of the electrical system. Each sensor data also extends over a plurality of time windows and is correlated to a plurality of data classes, such that sensor data at a particular time window has a value that falls into one of the data classes. For each sensor data the processing unit 30 is configured to assign the sensor data at each time window into a corresponding data class on the basis that sensor data at a particular time window has a value that falls into that corresponding data class. For each physical parameter of a component the processing unit is configured to determine the load spectrum by assigning each data to its data class defined by a value range between a minimum and maximum value. The load spectrum is the sum of all data classes characterized by the duration of data in each class and the value ranges of each data class. The processing unit 30 is configured determine a predicted lifetime for the component comprising application of an aging model from at least one aging model to the corresponding load spectrum for each physical parameter of a component. The processing unit 30 is configured also to determine a predicted lifetime for each component of the at least one component.

According to an example, the processing unit is configured to determine a predicted residual lifetime of the electrical system, comprising a determination of the component that has a shortest predicted lifetime.

According to an example, determination of the predicted residual lifetime of the electrical system comprises utilization of at least one safety margin.

In an example, each safety margin is based on a determined statistical quality of the relevant sensor data.

According to an example, each component of the at least one component has a different safety margin of the at least one safety margin.

According to an example, the at least one physical property comprises one or more of temperature, humidity, electrical current, electrical resistance, vibration, acceleration, reaction time.

In an example, sensor data can be used in combination. For example, from a combination of humidity and temperature values, the dewpoint can be determined. Therefore, periods of time below the dewpoint ("time of wetness") can be determined and qualified/identified as periods of high ageing influence, because condensed humidity increases the risk of surface creep currents, with subsequent partial discharge and polymer destruction in the example of switchgear). Such multi-parameter ageing can be accounted for with for example an Eyring model.

According to an example, the at least one sensor data comprises one or more of temperature measurement data, humidity measurement data, electrical current measurement data, electrical resistance measurement data, vibration measurement data, acceleration measurement data, reaction time measurement data.

According to an example, the at least one sensor comprises one or more of temperature sensor, humidity sensor, electrical current sensor, electrical resistance sensor, vibration sensor, accelerometer, reaction time sensor.

According to an example, each load spectrum of the plurality of load spectrum for a corresponding physical parameter of a component defines the percentage of time within a certain load class.

According to an example, for each physical parameter of a component the processing unit is configured to determine plurality of rates of change of sensor data. Each time window of the plurality of time windows has an associated rate of change of sensor data assigned to it. Determination of the predicted lifetime for the component can then comprise utilization of the plurality of rates of change of sensor data for each physical parameter of the component.

According to an example, the at least one aging model comprises one or more of Palmgren-Miner's rule, Arrhenius, Coffin-Manson, Eyring.

According to an example, the aging model used for one physical parameter of a component is different to the aging model used for a different physical parameter of the component.

In an example, a different aging model is used for different physical parameters.

According to an example, the at least one component comprises a busbar.

According to an example, the electrical system is a switchgear or circuit breaker.

Figure 2:
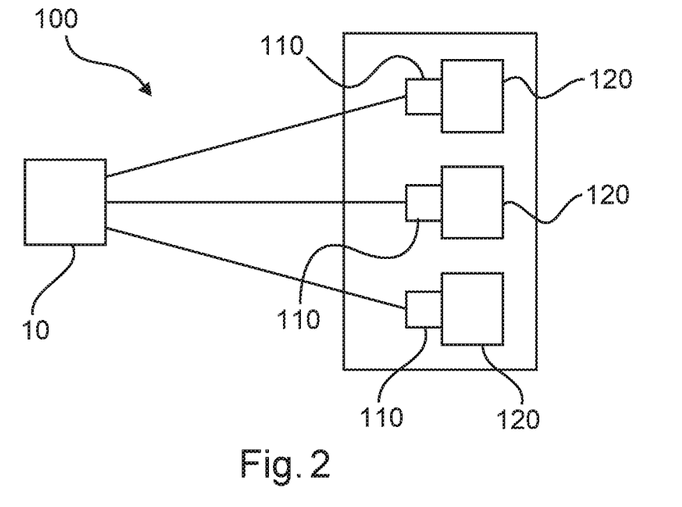
FIG. 2 shows a schematic representation of an example of a system for the prediction of the residual lifetime of an electrical system.

FIG. 2 shows a system 100 for prediction of the residual lifetime of an electrical system. The system 100 comprises an apparatus 10 for prediction of the residual lifetime of an electrical system as described above with respect to the examples of FIG. 1. The system also comprises at least one sensor 110. The at least one sensor 110 is configured to acquire at least one sensor data comprising measurement of at least one physical parameter of at least one component 120 of an electrical system 130. The at least one sensor 110 is configured to provide the at least one sensor data to the processing unit 30 of the apparatus 10.

Figure 3:
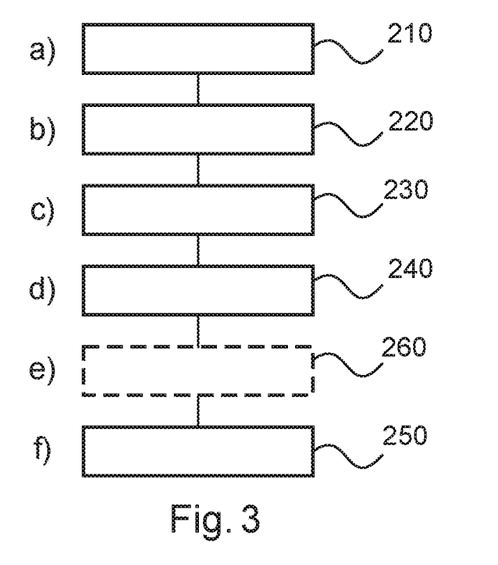
FIG. 3 shows a method for the prediction of the residual lifetime of an electrical system.

FIG. 3 shows a method 200 for prediction of the residual lifetime of an electrical system in its basic steps. The method 200 comprises:

in a providing step 210, also referred to as step a), providing at least one sensor data from at least one sensor to a processing unit, wherein the at least one the sensor data comprises the measurement of at least one physical parameter of at least one component of an electrical system, wherein each sensor data is associated with a corresponding sensor and relates to the measurement of one physical parameter of a corresponding component of the electrical system, wherein each sensor data extends over a plurality of time windows and is assigned to a certain data class, such that sensor data at a particular time window has a value that falls into one of the data classes;

in an assigning step 220, also referred to as step b), assigning for each sensor data by the processing unit the sensor data at each time window into a corresponding data class on the basis that sensor data at a particular time window has a value that falls into that corresponding data class;

in a determining step 230, also referred to as step c), determining for each physical parameter of a component by the processing unit the load spectrum, wherein the load spectrum is the sum of all data classes containing the sum of all measured data characterized by the value range and time duration within each data class; and in a determining step 240, also referred to as step d), determining by the processing unit a predicted lifetime for the component comprising application of an aging model from at least one aging model to the corresponding plurality of load spectrums for each physical parameter of a component; and in a determining step 250, also referred to as step f), determining by the processing unit a predicted lifetime for each component of the at least one component, by carrying out steps c) and d) for each component of the at least one component.

In an example, in step g) determining the predicted residual lifetime of the electrical system comprises a determination of the component that has a shortest predicted lifetime.

In an example, in step g) determining the predicted residual lifetime of the electrical system comprises utilizing at least one safety margin.

In an example, each component of the at least one component has a different safety margin of the at least one safety margin.

In an example, the at least one physical property comprises one or more of temperature, humidity, electrical current, electrical resistance, vibration, acceleration, reaction time.

In an example, the at least one sensor data comprises one or more of temperature measurement data, humidity measurement data, electrical current measurement data, electrical resistance measurement data, vibration measurement data, acceleration measurement data, reaction time measurement data.

In an example, the at least one sensor comprises one or more of temperature sensor, humidity sensor, electrical current sensor, electrical resistance sensor, vibration sensor, accelerometer, reaction time sensor.

In an example, the sum of time windows of sensor data within one data class related to the total lifetime of the component defines the percentage of time within a certain data class.

In an example, the method comprises step e) wherein for each physical parameter of a component the method comprises determining 260 by the processing unit a plurality of rates of change of sensor data, wherein each time window of the plurality of time windows has an associated rate of change of sensor data assigned to it, and the different rates of change are assigned to defined data classes, and wherein step f) comprises utilizing the plurality of rates of change of sensor data for each physical parameter of the component in the different data classes, comparing to e.g. a defined maximum number of cycles within a certain data class or defining threshold values. If the threshold values for rate of change are exceeded by a defined number of data, the residual lifetime of the component is reduced according to the lifetime model in the processing unit, and wherein step f) comprises carrying out the steps c), d) and e) for each component of the at least one component.

In an example, the at least one aging model comprises one or more of Palmgren-Miner's rule, Arrhenius, Coffin-Manson, Eyring.

In an example, the aging model used for one physical parameter of a component is different to the aging model used for a different physical parameter of the component.

In an example, a different aging model is used for different physical parameters.

In an example, the at least one component comprises a busbar.

In an example, the electrical system is a switchgear or circuit breaker.

Figure 4:
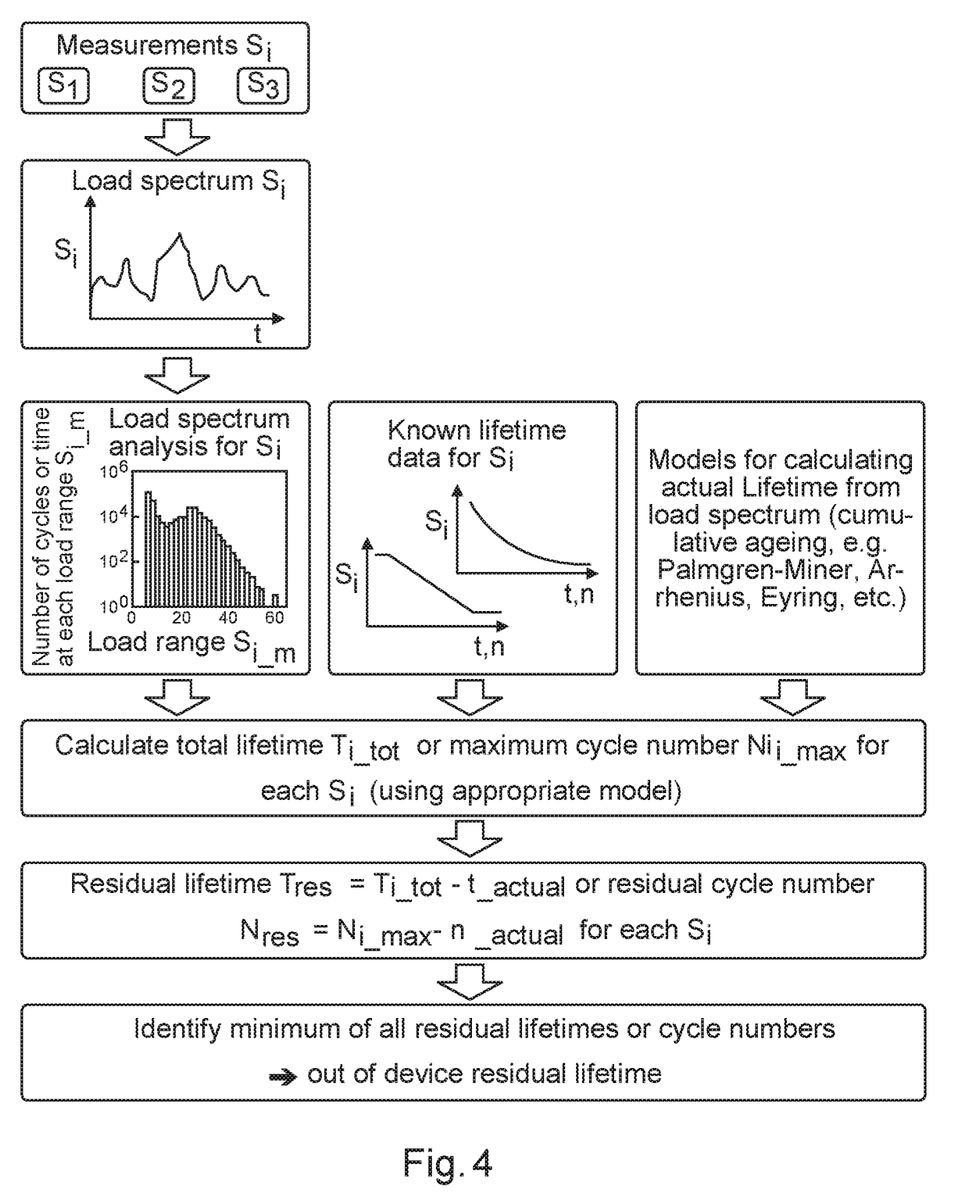
FIG. 4 shows a schematic view of the real-time lifetime prediction process.

The apparatus, system and methods for the prediction of the residual lifetime of an electrical system are explained in specific detail with respect to FIG. 4.

A circuit breaker, which can form part of a switchgear or form switchgear itself, is a mechatronic device for interrupting the flow of current in an electrical system with a switching operation. A generator circuit breaker (GCB) represents a safety element in power plants, which interrupts very high fault currents (up to 250 kA) in the bus bar between generator and main transformer. Additionally, operational procedures, such as synchronization of the generator with the grid are simplified compared to block layouts without GCB.

As a safety element, the circuit breaker as such is rarely in operation, but 100% availability and reliability need to be assured. When applied in high frequent switching applications such as pumped storage power plants, the ablation of contacts is much higher compared to base load power plants. There, the GCB system is used to change the operation between pumping/generation mode very quickly in addition to its safety function.

Typical life spans are 20 to 40 years. Failures can cause critical situations in a power plant and therefore regular inspections and overhauls are important. The residual life of a GCB is the amount of ablation the breaker can take before an overhaul is required. The breaker has three types of residual life; the overhaul occurs when the first reaches zero:

Electrical Residual Life: Each time a circuit breaker operates its contacts get ablated and eventually are no longer functional due to cumulative ablation. The amount of ablation suffered depends on the interrupted current at the times of the interruption and has to be traced for each contact separately. (Typically, there are three phases and therefore three electrical residual life curves.) Thus, each switching operation results in a reduction of residual life, with different amounts of ablation.

Another example are polymer electrical insulators, which degrade with time, temperature and humidity. The higher the temperature, the faster the degradation, leading to embrittlement, increased surface roughness with consecutive creep currents and partial discharge. High temperature gradients can even lead to cracks, also promoting partial discharge leading to further degradation. High temperature excursions beyond the specified temperature accelerate the ageing and strongly reduce residual lifetime.

Mechanical Residual Life: The mechanical residual life is reduced by one every time the circuit breaker is triggered. Mechanical residual life represents mechanical wear-out of the system. Unlike in the electrical case, there is only one curve for mechanical residual life.

Time-based Residual Life: If neither the mechanical nor the electrical residual life is used up before a certain time limit, an overhaul is conducted nevertheless to account for other problems not modeled in the residual life concepts above.

The apparatus, system and methods for the prediction of the residual lifetime of an electrical system as described above with respect to FIGS. 1-3, and as now explained in specific detail with respect to FIG. 4. addresses these issues, where the specific example of a switchgear is discussed.

As shown in FIG. 4, the prediction of the residual lifetime of an electrical system, such as a switchgear, involves the use of installed sensors. These can be permanently installed. These measure physical parameters of the switchgear (e.g. temperature, current, humidity, etc.), and such measurement can be continuous or periodic, and will from now on be considered to be continuous measurements in this specific example. These continuous measurements are used as input for a continuous real-time calculation of the actual load spectrum on the specific switchgear (i.e. percentage of time within a certain load class). This load spectrum is then used to calculate in real time (or periodically at regular intervals, e.g. daily, weekly) a residual lifetime based on appropriate prediction models (e.g. Miner's rule, Arrhenius, Coffin-Manson, Eyring, etc.).

In detail, the solution consists of following steps:

Continuous measurement of at least one (or several) physical properties of the switchgear or of critical components, for example: Busbar temperature, number of thermal cycles between defined temperature levels, busbar current, humidity in the compartment, partial discharge, . . . .

Definition of the contribution of the considered property to the total load spectrum, i.e. the duration of states within a certain level (data class) of the respective property. E.g. number of hours at a temperature between 50-60° C. or between 80-90° C., or number of fast temperature changes (thermal shocks) with more than 10° C./minute, etc.

Determine and continuously update the lifetime load spectrum for the considered property derived from the contributions within the different load levels (data classes)

Apply an appropriate ageing model to each physical property using the assessed load spectrum, and extrapolating it into the future. For example: Palmgren-Miner's rule for cumulative loads, Arrhenius-model for thermal ageing, Coffin-Manson for low cycle fatigue thermomechanical loads, Eyring model for multiple load consideration, etc.

Continuously or periodically calculate the expected residual lifetime of selected components based on each measurement and the according model, and give the lowest value as the residual lifetime of the switchgear, i.e. as the time until the next service or overhaul (including an appropriate safety margin based on the statistical quality of the available data).

The following specific embodiments are described in order to provide a greater understanding how the presently described apparatus, system and method for prediction of the residual lifetime of an electrical system, operate:

The invention principle can be applied to a wide variety of measurements and models. Here, to complement the detailed discussion associated with FIGS. 1-4, just a few embodiments are described:

One simple embodiment is based on the continuous measurement of the busbar temperature, which has an effect, for example, on the ageing of insulators in thermal contact with the busbar as well as on the bolted connections of the busbar itself.

With respect to the insulators, an Arrhenius or Palmgren-Miner-approach can be used. Temperature ranges are defined, and for each of these a total lifetime of the insulator is known from the material data and thermal class of the polymer or from appropriate testing. The actual temperatures measured are correlated to the respective temperature range and the actual time (or rather percentage of time) at this temperature is saved in the system. The Arrhenius or Miner lifetime model can then calculate an actual lifetime based on the spectrum of service temperatures and the different durations at this temperature level, i.e. calculating the cumulative damage at different temperature levels. If the percentage of time at higher temperatures increases during the service life, accordingly the lifetime model will calculate a shorter total service life and an according correction of the residual lifetime is provided. E.g. an empiric rule is that the lifetime of polymers is reduced by 50% with each 10° C. increase in service temperature. If 10° C. temperature classes are defined, and the lifetime at the nominal use temperature is known (e.g. from the material thermal class definition), for each deviation from this nominal temperature the change in cumulative damage can be calculated. If full Arrhenius curves of the polymer ageing are available, the calculation can be accordingly more accurate.

The model can be extended for example by considering incidents of high temperature gradients as additional ageing factors, with an according additional shortening of service lifetime.

An alternative extension is to consider humidity measurements, if polymer ageing at various humidities is known. Then periods at high temperature and high humidity then result in faster ageing than periods at the same temperature level but low humidity. From the combination of humidity and temperature values also the dewpoint can be determined, and so for example periods below the dewpoint ("time of wetness") as periods of high ageing influence identified (condensed humidity increases the risk of surface creep currents, with subsequent partial discharge and polymer destruction). Such multiparameter ageing can be accounted for with e.g. an Eyring model.

Another extension is to consider partial discharge monitoring, by considering progressive ageing indicated by partial discharge in the system (e.g. due to pollution or material defects).

With respect to bolted busbar connections, the temperature measurement can be used to quantify thermal cycles and gradients, which will always lead to a progressive loosening of the connections. This in turn results in higher contact resistance and accordingly higher busbar temperature; the actual effect (number of thermal cycles or gradients causing a certain degree of loosening) can be established by appropriate accelerated tests. Alternatively (or in addition), the measurement of the current and its gradients can also deliver similar or additional information on the load and ageing of the busbar connections. So, by measuring e.g. temperature cycles, current or vibration in service, these events can be correlated to the known progression of bolted connection behavior. If these events are recorded and their progression is extrapolated, the time until a critical level of contact resistance is reached can be estimated e.g. using a Miner, Coffin-Manson or Eyring model.

In a more complex embodiment, this model can predict the increase in the average busbar temperature by bolt loosening, which again can be used to counter-check to the above mentioned thermal model to predict insulator ageing more accurately.

Further models involve using mechanical measurements (number of activations, acceleration, reaction time, etc.) on moving switchgear parts, if knowledge on the effect of these parameters on ageing of the mechanical system exists (e.g. by quantifying bolt loosening based on accelerated mechanical ageing tests). For such cases similarly to the thermal load spectrum also mechanical load spectra can be defined, which are statistically evaluated during the device lifetime and used for extrapolation for residual lifetime w.r.t. mechanical loads.

It has to be noted that embodiments of the invention are described with reference to different subject matters. In particular, some embodiments are described with reference to method type claims whereas other embodiments are described with reference to the device type claims. However, a person skilled in the art will gather from the above and the following description that, unless otherwise notified, in addition to any combination of features belonging to one type of subject matter also any combination between features relating to different subject matters is considered to be disclosed with this application. However, all features can be combined providing synergetic effects that are more than the simple summation of the features.

While the invention has been illustrated and described in detail in the drawings and foregoing description, such illustration and description are to be considered illustrative or exemplary and not restrictive. The invention is not limited to the disclosed embodiments. Other variations to the disclosed embodiments can be understood and effected by those skilled in the art in practicing a claimed invention, from a study of the drawings, the disclosure, and the dependent claims.

In the claims, the word "comprising" does not exclude other elements or steps, and the indefinite article "a" or "an" does not exclude a plurality. A single processor or other unit may fulfill the functions of several items re-cited in the claims. The mere fact that certain measures are re-cited in mutually different dependent claims does not indicate that a combination of these measures cannot be used to advantage. Any reference signs in the claims should not be construed as limiting the scope.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A prediction system for prediction of the residual lifetime of an electrical system, the prediction system comprising:
   a sensor; and
   a processor,
   wherein the sensor is configured to receive sensor data comprising a measurement of a physical parameter of a component of an electrical system,
   wherein the sensor data is associated with the sensor and relates to the measurement of the physical parameter of the component of the electrical system,
   wherein the sensor data extends over a plurality of time windows and the sensor data at each of the plurality of time windows is assigned to a certain data class of a plurality of data classes, such that the sensor data at each of the plurality of time windows has a value that falls into one of the plurality of data classes and wherein the plurality of data classes encompasses a data range within which the sensor data can vary, wherein for the sensor data the processor is configured to assign the sensor data at each of the plurality of time windows into a corresponding one of the plurality of data classes on a basis that the sensor data at a particular one of the plurality of time windows has a value that falls into the corresponding one of the plurality of data classes, wherein for the physical parameter of the component, the processor is configured to determine a load spectrum, the load spectrum comprising a sum of all of the plurality of data classes including data values and duration in each of the plurality of data classes for the physical parameter of the component, wherein the processor is configured to determine the total duration of the sensor data with each of the plurality of data classes by summing up the plurality of time windows of the sensor data within each of the plurality of data classes, wherein the processor is configured to determine a predicted lifetime for the component comprising the application of an aging model to the load spectrum for the physical parameter of the component, and wherein the processor is further configured to continuously update a planning of system maintenance for the electrical system based on the predicted lifetime for the component.

2. The prediction system according to claim 1, wherein the processor is configured to determine a predicted residual lifetime of the electrical system comprising a determination of the component from a plurality of components that has a shortest predicted lifetime.

3. The prediction system according to claim 1, wherein the determination of the predicted lifetime of the component comprises utilization of at least one safety margin.

4. The prediction system according to claim 3, comprising a plurality of components wherein each of the plurality of components has a different safety margin of the at least one safety margin.

5. The prediction system according to claim 4, wherein the processor is configured to determine a predicted lifetime for each component of the plurality of components.

6. The prediction system according to claim 1, wherein the physical parameter comprises one or more of temperature, humidity, electrical current, electrical resistance, vibration, acceleration, or reaction time.

7. The prediction system according to claim 1, wherein the sensor data comprises one or more of temperature measurement data, humidity measurement data, electrical current measurement data, electrical resistance measurement data, vibration measurement data, acceleration measurement data, or reaction time measurement data.

8. The prediction system according to claim 1, wherein the sensor comprises one or more of a temperature sensor, humidity sensor, electrical current sensor, electrical resistance sensor, vibration sensor, accelerometer, or reaction time sensor.

9. The prediction system according to claim 1, wherein the load spectrum for the physical parameter of the component defines a percentage of time within one of the plurality of data classes.

10. The prediction system according to claim 1, wherein, for the physical parameter of the component, the processor is configured to determine a plurality of rates of change of the sensor data, wherein each time window of the plurality of time windows has an associated rate of change of sensor data assigned to it, and wherein determination of the predicted lifetime for the component comprises utilization of the plurality of rates of change of sensor data for the physical parameter of the component.

11. The prediction system according to claim 1, wherein the aging model comprises one or more of Palmgren-Miner's rule, Arrhenius, Coffin-Manson, or Eyring.

12. The prediction system according to claim 1, comprising measurement of a plurality of physical parameters of the component, wherein the aging model used for one of the plurality of physical parameters of the component is different from the aging model used for a different one of the plurality of physical parameters of the component.

13. The prediction system according to claim 1, wherein the component comprises a busbar.

14. The prediction system according to claim 1, wherein the electrical system comprises a switchgear or circuit breaker.

15. The prediction system according to claim 1, wherein the processor is further configured to indicate a service requirement by the electrical system, when the processor determines that the component has met or exceeded the predicted lifetime.

16. A method for prediction of a residual lifetime of an electrical system, comprising:

a) providing sensor data from a sensor to a processor, the sensor data comprising a measurement of a physical parameter of a component of an electrical system, the sensor data being associated with the sensor and relating to the measurement of the physical parameter of the component of the electrical system, the sensor data extending over a plurality of time windows and the sensor data at each of the plurality of time windows being assigned to a data class of a plurality of data classes, such that the sensor data at each of the plurality of time windows has a value that falls into one of the plurality of data classes and wherein the plurality of data classes encompasses a data range within which the sensor data can vary;

b) assigning for the sensor data by the processor the sensor data at each of the plurality of time windows into a corresponding one of the plurality of data classes on a basis that the sensor data at a particular one of the plurality of time windows has a value that falls into the corresponding one of the plurality of data classes;

c) determining for each physical parameter of a component by the processor a load spectrum, the load spectrum comprising a sum of all of the plurality of data classes including data values and duration in each of the plurality of data classes for the physical parameter of the component, wherein the processor is configured to determine the total duration of the sensor data within each of the plurality of data classes by summing up the plurality of time windows of the sensor data within each of the plurality of data classes;

d) determining by the processor a predicted lifetime for the component comprising application of an aging model from at least one aging model to the corresponding load spectrum for each physical parameter of the component; and g) continuously updating, by the processor, a planning of system maintenance for the electrical system based on the predicted lifetime for the component.

17. The method according to claim 16, further comprising:
- when the processor determines that the component has met or exceeded the predicted lifetime, servicing the electrical system.

18. The method according to claim 16, wherein the electrical system comprises a plurality of components including the component, the method further comprises:
- f) determining, by the processor, a predicted lifetime for each of the plurality of components by carrying out steps c) and d) for each component of the plurality of components.

* * * * *